US 8,350,569 B2

(12) United States Patent
Huber

(10) Patent No.: US 8,350,569 B2
(45) Date of Patent: Jan. 8, 2013

(54) DEVICE AND METHOD FOR SWITCHING A PIN DIODE

(75) Inventor: Klaus Huber, Effeltrich (DE)

(73) Assignee: Siemens Aktiengesellschaft, Munich (DE)

( * ) Notice: Subject to any disclaimer, the term of this patent is extended or adjusted under 35 U.S.C. 154(b) by 549 days.

(21) Appl. No.: 12/547,628

(22) Filed: Aug. 26, 2009

(65) Prior Publication Data

US 2010/0052683 A1  Mar. 4, 2010

(30) Foreign Application Priority Data

Aug. 29, 2008 (DE) .................. 10 2008 044 962

(51) Int. Cl.
*G01R 33/00* (2006.01)
*H03K 17/74* (2006.01)
(52) U.S. Cl. ........ 324/322; 324/311; 324/318; 333/101; 327/503
(58) Field of Classification Search .......... 324/300–322; 382/128–133; 600/407–464; 327/503
See application file for complete search history.

(56) References Cited

U.S. PATENT DOCUMENTS

| | | | | |
|---|---|---|---|---|
| 6,747,452 B1 * | 6/2004 | Jectic et al. | .................. | 324/311 |
| 6,798,207 B2 * | 9/2004 | Viti | ............... | 324/322 |
| 6,850,067 B1 * | 2/2005 | Burl et al. | .................. | 324/322 |
| 6,937,846 B1 | 8/2005 | Herzberg | | |
| 2006/0038568 A1 * | 2/2006 | Oppelt | .......... | 324/322 |

* cited by examiner

*Primary Examiner* — Melissa Koval
*Assistant Examiner* — Emily Chan
(74) *Attorney, Agent, or Firm* — Schiff Hardin LLP

(57) ABSTRACT

A circuit for switching a PIN diode has a PIN diode and an inductor (in particular a coil) as well as a direct voltage source and a group of switches, wherein in a first switch setting of the group of switches the PIN diode can be fed with current from the direct voltage source in its admission direction; and in a further switch setting the PIN diode and the inductor are separated from the direct voltage source and are arranged in a closed current loop such that the inductor can generate a discharge current upon transitioning to the further switch setting, which discharge current is directed to the PIN diode opposite to the current generated by the direct voltage source (DC).

14 Claims, 2 Drawing Sheets

DEVICE AND METHOD FOR SWITCHING A PIN DIODE

BACKGROUND OF THE INVENTION

1. Field of the Invention

The present invention concerns circuit for switching a PIN diode, a transmission/reception diplexer, a magnetic resonance apparatus and a method for switching a PIN diode.

2. Description of the Prior Art

In magnetic resonance (MR) tomography, the different spin relaxation times T1 and T2 of different tissue types are typically used to generate an image contrast. However, for a range of tissues in the human body, the relaxation times are so short that they provide little or no signal with the typical sequences that can be realized by current technology, thus these types of tissues remain black in the MR image. Sequences known as UTE (Ultra Short Echo Time) sequences, in which 10 to 200 times less time passes between excitation and readout than in conventional magnetic resonance sequences, offer a solution to this problem. However, magnetic resonance systems normally contain a transmission/reception diplexer whose switching time limits the minimum feasible echo time to 50 to 100 μs. PIN diodes that can be switched into a radio-frequency conductive state when direct current flows through them, and into a radio-frequency blocking state via deactivation of a voltage or application of a direct voltage in the blocking direction are typically used as switching elements in a fast transmission/reception diplexer. The PIN diodes can switch power in the range of multiple kilowatts. However, the switching from the conductive state into the blocking state is temporally limited by the ultimate speed with which the charge carriers generated by the current feed into the I layer of the diode are recombined again, or drained by active discharging. The echo time has previously been adapted to the technical limits of the transmission/reception diplexer, such that the potential of UTE technology cannot be fully exploited.

SUMMARY OF THE INVENTION

An object of the present invention is to provide a possibility for faster switching of a PIN diode from the conductive state into the blocking state.

This object is achieved in accordance with the invention by a circuit, a transmission/reception diplexer, a magnetic resonance apparatus and a method.

The circuit is designed to switch (in particular discharge) a PIN diode, and has at least one PIN diode and an inductor (in particular a coil). The circuit also has a direct voltage source and a group of switches with multiple (in particular at least three) switch settings. The circuit is designed so that the PIN diode can be fed with current in its conducting direction by the direct voltage source in a first switch setting; the PIN diode is thus radio-frequency permeable or radio-frequency conductive.

In a further switch setting, the PIN diode and the inductor are separated from the direct voltage source and are in a closed current loop. Due to the continuity of the current through the inductor (in particular coil current), the inductor in this current loop consequently acts as a (temporary) direct current source that allows a discharge current to flow through the PIN diode, this discharge current is polarized opposite to the current generated by the direct voltage source (flows in the blocking direction). The discharge of the PIN diode is thereby significantly accelerated. The PIN diode thus can be transferred into a radio-frequency blocking state much more quickly than before. Given a sufficiently dimensioned inductor, the PIN diode is even negatively charged by the discharge current, which produces an effect similar to an application of a blocking voltage.

In the above circuit the inductor can be fed with current in the first switch setting. To avoid power loss, however, a circuit is preferred in which the inductor is not, or is not continuously, supplied with current in the first switch setting. A circuit is therefore preferred in which, to feed the inductor with current—and thus to prepare the inductor as a current source of the closed current loop—a second switch setting is inserted between first switch setting and the further (then third) switch setting in which the inductor can be fed by the direct voltage source. The inductor is thereby magnetically "charged". The flow of current advantageously lasts 1 μs to 15 μs, in particular 2 μs to 10 μs, especially 3 μs to 10 μs. The second switch setting is advantageously shorter than the first switch setting.

An initial discharge current is preferably in the range between 1 A and 5 A.

Semiconductor components—in particular transistors, especially field effect transistors (FETs)—are preferably used as switches.

A capacitor can be connected in parallel with the PIN diode for voltage limitation.

A circuit can be desired in which the PIN diode cannot be fed with current by the direct voltage source in the second switch setting. The PIN diode is thus disconnected from the direct voltage source in the second switch setting but not connected to the inductor. This circuit can be realized particularly simply via internal triggering, however extends the switching time into the RF-blocking state of the PIN diode by at least the duration that is required to feed or, respectively, charge the inductor with current, for example 3 μs.

For even faster switching of the PIN diode from the radio-frequency conductive state into the radio-frequency blocking state, a circuit is preferred in which the PIN diode can be fed by current from the direct voltage source in the second switch setting, thus the inductor can be fed with current at the same time as the PIN diode. The current feed preferably ensues a short time before switching into the third switch setting, for example 3 μs to 10 μs prior for a charge pulse lasting 3 μs.

A circuit is preferred in which
- the PIN diode is arranged in a first current branch and the inductor is arranged in a second current branch parallel to the first current branch,
- a first switch of the group of switches is arranged in the first current branch in series with the PIN diode,
- a second switch and a third switch of the group of switches are arranged in series on both sides of the inductor in the second current branch,
- the first current branch is connected with the second current branch via an additional diode, wherein the additional diode is switched from the first current branch into the second current loop in the admission direction.

In particular given a non-simultaneous current feed of the inductor and PIN diode by the direct voltage source, a circuit can be preferred in which
- in the first switch setting, the first switch is closed and the second switch and/or the third switch are open;
- in the second switch setting, the first switch is open and the second switch and the third switch are closed; and
- in the third switch setting, the first switch is open and the second switch or the third switch is closed.

In particular given a temporally simultaneous current feed of the inductor and PIN diode, a circuit is preferred in which in the first switch setting, the first switch is closed and the second switch and/or the third switch are open;

in the second switch setting, the first switch is closed and the second switch and the third switch are closed; and in the third switch setting, the first switch is open and the second switch or the third switch is closed.

One or more switches can be triggered by one or more other switches for switching, for example in which the second switch and the third switch are switched by the first switch. This is a particularly simple circuit possibility.

One or more switches (in particular all switches) can be switched by a control unit. This is more complicated but also enables more flexible switch settings, for example the switch setting in which inductor and PIN diode can intermittently be fed with current simultaneously.

The circuit can also have a radio-frequency resistor (L1, C1) connected in series at the anode side with regard to the PIN diode. An effect on the circuit after the radio-frequency resistor (L1, C1) in a radio-frequency operation and vice versa can thereby be suppressed or even prevented.

The transmission/reception diplexer, which is in particular provided and designed for a magnetic resonance apparatus (especially an MR tomography apparatus) has at least one of the above circuits (at least two such circuits in the case of an MR tomography apparatus).

The transmission/reception diplexer is advantageously designed to switch or to be switched into a reception mode at the beginning of the third switch setting of the circuit for switching a PIN diode.

The magnetic resonance apparatus (especially an MR tomograph) has at least one such transmission/reception diplexer and is made able to use UTE sequences.

The method for switching a PIN diode includes at least the following steps: (a) operation of a PIN diode in a radio-frequency conductive state; and consequently (b) operation of the PIN diode in a radio-frequency blocking state in which a direct current in the blocking direction is conducted via the PIN diode, in particular at the beginning of the radio-frequency blocking state.

A method is preferred in which step (b) includes at least the following sub-Steps: (b1) feeding an inductor (in particular coil) with current before switching the PIN diode over into the radio-frequency blocking state; (b2) connection of the PIN diode to the inductor as a current source at the beginning of the radio-frequency blocking state.

A method is preferred in which Step (b1) lasts 1 μs to 15 μs, advantageously 2 μs to 10 μs (especially 3 μs to 10 μs).

DESCRIPTION OF THE PREFERRED EMBODIMENTS

Figure 1:
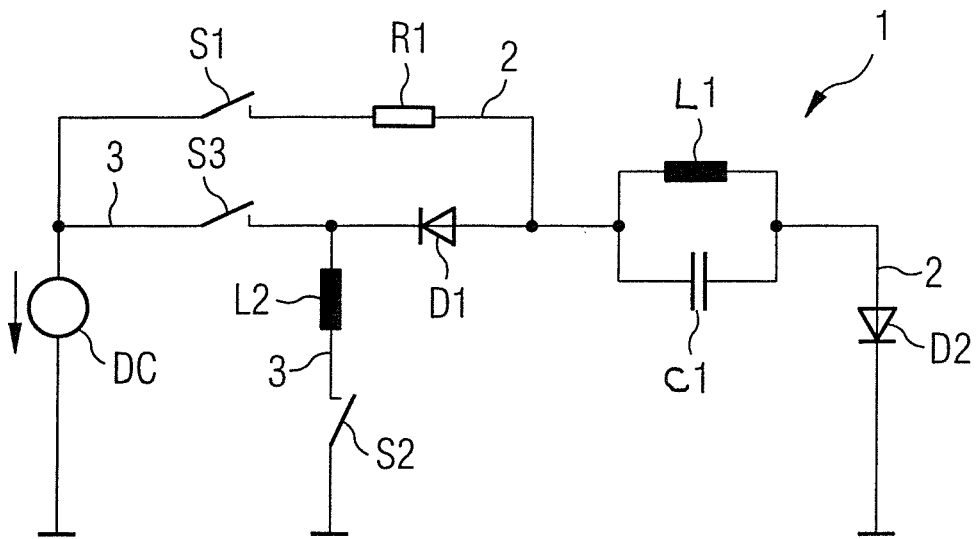
FIG. 1 is a circuit diagram of an embodiment of a circuit for quick discharging of a PIN diode in accordance with the invention.

FIG. 1 is a principle circuit diagram of a circuit 1 for fast discharging (and therefore switching) of a PIN diode D2. The PIN diode D2 is electrically connected in parallel with a direct voltage source DC via a switch S1. Stated more precisely, the switch S1 is connected in series between the positive pole of the direct voltage source DC and the anode side of the PIN diode D2. The cathode side of the PIN diode D2 is connected with ground, whereby its simple and efficient cooling is enabled. Upon operation of the direct voltage source DC, the PIN diode D2 is fed with a direct current in the admission direction given a closed switch S1. In this state it is conductive in the radio-frequency range. An ohmic resistor R1 for current limitation and a radio-frequency resistor in the form of an oscillating circuit (made up of capacitor C1 and coil L1 connected in parallel) are also arranged in series between switch S1 and PIN diode D2. Via the radio-frequency resistor L1, C1, the PIN diode D2 is separated from the other elements of the circuit 1 for radio-frequency currents, as is required for a magnetic resonance apparatus, for example. In other words, the radio-frequency resistor L1, C1 has the effect that only the PIN diode D2 of the circuit 1 is visible for radio-frequency currents. However, it has no significant effect on direct currents. The switch S1, the ohmic resistor R1, the radio-frequency resistor L1, C1 and the PIN diode D2 are thus connected in series in a first current branch 2 which can be alternately switched to conduct or be interrupted by the switch S1.

A second current branch 3 electrically parallel to the first current branch 2 can be connected to the direct voltage source DC. A second coil (auxiliary coil) L2 and on both sides of this a switch S3 and a switch S2 are arranged in series between the positive pole of the direct voltage source DC and the ground in the second current branch 3. The first current branch 2 and the second current branch 3 are connected with one another via a diode Di that is connected on the anode side with a first current branch 2 between ohmic resistor R1 and radio-frequency resistor L1, C1 and, on the cathode side, with the second current branch 3 directly at the auxiliary coil L2. The diode D1 is thus conductive for currents from the first current branch 2 to the second current branch 3 and blocking for currents going in the reverse.

Figure 2:
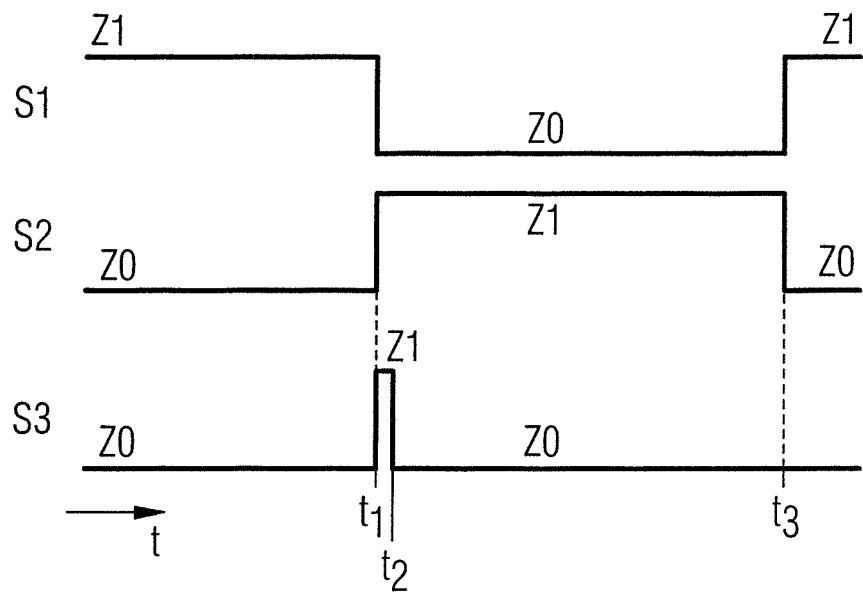
FIG. 2 shows a switch timing of the switch used in the circuit from FIG. 1 as a plot of a signal level in arbitrary units against time.

FIG. 2 shows a possible switch timing of the switches S1, S2, S3 used in the circuit from FIG. 1, using which the operation of the circuit 1 should be explained more precisely in the following. In FIG. 2 an "on" state is designated with the reference character Z1 and an "off" state is designated with reference character Z0.

In a first switch state which lasts up to a point in time t1, the switch S1 is activated or, respectively, closed. A current is generated by the direct voltage source DC through the switch S1, then the ohmic resistor R1, then through the radio-frequency resistor L1, C2 and then through the PIN diode D2 to ground. In other words, the first current path 2 conducts. The switches S2 and S3 are deactivated or, respectively, blocking so that no current flows through the auxiliary coil L2 or, respectively, the second current loop 3. In the first switch state, the PIN diode is conductive for radio-frequency currents.

At the point in time t1, the switch S1 deactivates and thereby triggers the activation of both switch S2 and switch S3. In this second switch state the first current branch 2 no longer carries current. Current now flows through the second current branch 3 and "magnetically charges" the auxiliary coil L2.

A short time later (for example 3 μs later), the switch S3 deactivates again—controlled or automatically—at the point in time t2, whereby the third switch state is reached. In the third switch state, both the auxiliary coil L2 and the PIN diode D2 are separated from the direct voltage source DC but form a closed current loop via the diode D1 and ground.

In this current loop, due to the continuity of the coil current the auxiliary L2 coil acts like a (temporary) direct voltage source, which causes a discharge current to flow through the PIN diode D2, which discharge current is inversely polarized relative to the current generated by the direct voltage source DC (flows in the blocking direction). The discharging of the PIN diode D2 is thereby significantly accelerated, which PIN diode D2 can thus transition much more quickly than before into a radio-frequency blocking state. Given a sufficiently dimensioned coil L2 and "charge duration" t2-t1, the PIN diode D2 is even negatively charged by the discharging current, which produces an effect similar to an application of a blocking voltage. The diode D1 ensures that no parasitic currents flow in the reverse direction (admission direction of the PIN diode D2).

At the end of the blocking phase (point in time t3), the switches reset back into the first switch state.

Figure 3:
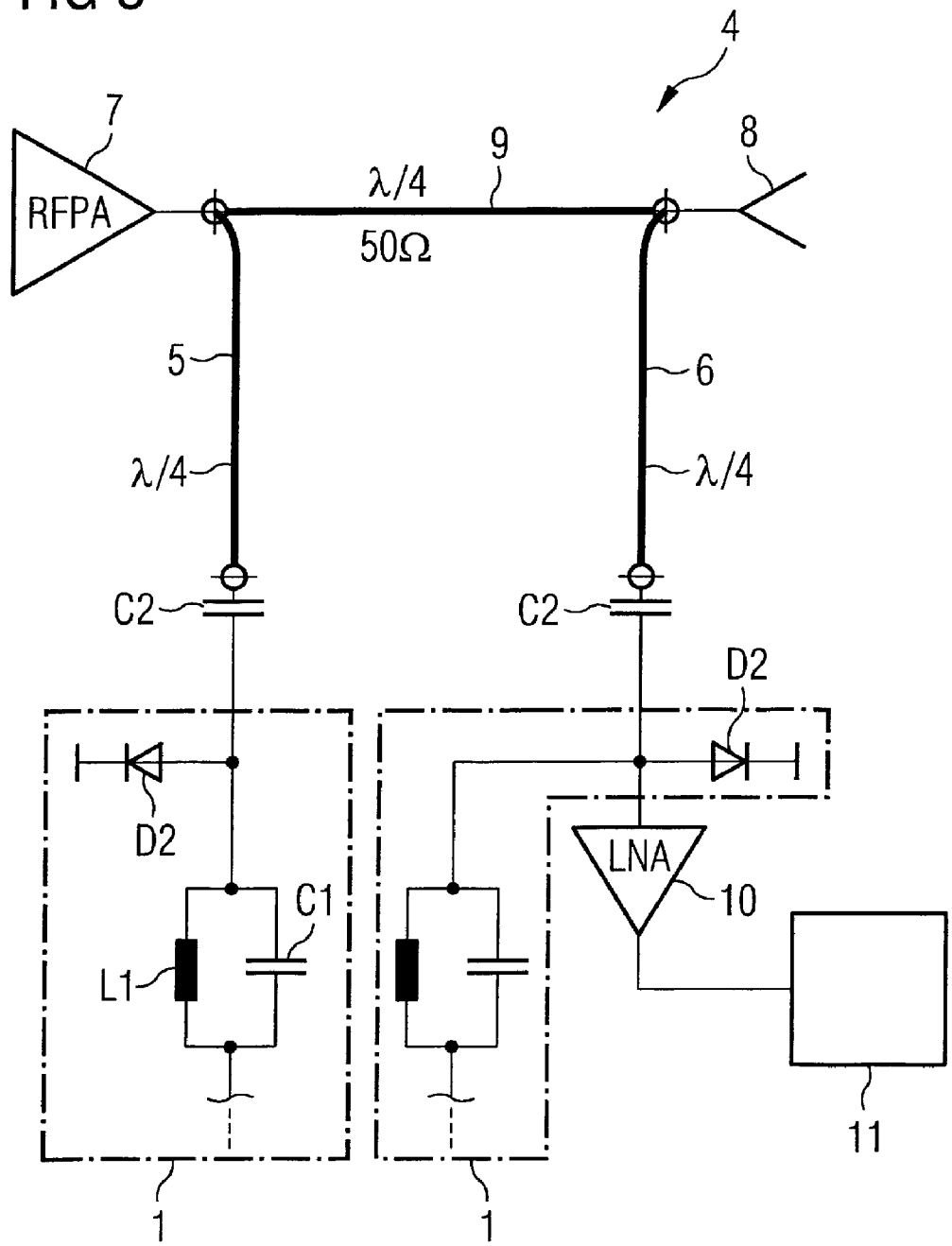
FIG. 3 is a circuit diagram of a transmission/reception diplexer.

FIG. 3 shows a simplified principle circuit diagram of a possible transmission/reception diplexer 4 with two circuits 1 according to FIG. 1, of which here only the PIN diode D2 and the radio-frequency resistor L1, C1 are shown for better clarity. At the anode side, the PIN diode D2 is connected at a branch to a capacitor C2 that serves as an RF short and direct current cut-off for a following 50Ω quarter wave line 5 or 6. The quarter wave line 5 of the left branch runs to a radio-frequency power amplifier (RFPA) 7; the right quarter wave line 6 runs directly to an antenna 8. The RFPA 7 is connected with the antenna via an additional (transversal) quarter wave line 9.

In transmission mode, both PIN diodes D2 are fed with current in the admission direction, for example in that the circuit 1 is located in the first switch state described in FIG. 2. A short is thereby created due to the connection of the PIN diode D2 with ground in the respective RF branch, which short is transformed by the quarter wave line 5, 6 into an open circuit. Effectively, only the RFPA 7 is connected with the antenna 8 in the radio-frequency domains, and thus signals fed into said RFPA 7 are amplified and sent via the (transversal) quarter wave line 9 to antenna, and from there out to a destination. In order to now be able to acquire ultrashort responses, the transmission/reception diplexer 4 must consequently be able to be switched very quickly into the reception mode.

In reception mode (which can be realized via the third switch setting according to FIG. 2, for example), both PIN diodes D2 are not fed with current and thus are highly resistive for a radio-frequency signal, which leads there to an open circuit. An RF short is thereby again caused at the RFPA 7, which induces an open circuit at the antenna end of the (transversal) quarter wave line 9. The RFPA 7 is thereby effectively decoupled from the antenna 8 in the radio-frequency domains. The resonance signals received by the antenna 8 are thus conducted only via the right quarter wave line 6, and in fact to a low-noise amplifier (LNA) 10 that then relays the amplified received signals to a receiver 11 for further processing and possible evaluation.

The present invention is naturally not limited to the shown exemplary embodiment.

The switches S2 and/or S3 from FIG. 1 can thus also be switched by means of a switching unit instead of being triggered by S1. This is more complicated but also allows more flexible switching possibilities.

Although modifications and changes may be suggested by those skilled in the art, it is the intention of the inventor to embody within the patent warranted hereon all changes and modifications as reasonably and properly come within the scope of his contribution to the art.

I claim as my invention:

1. A circuit for switching a PIN diode, comprising:
a PIN diode;
an inductor;
a direct current voltage source;
a group of switches;
said group of switches being settable to a first switch setting that causes the PIN diode to be fed with current from the direct current voltage source in a conducting direction of the PIN diode and that precludes said inductor from being fed with current; and
said group of switches being settable to a second switch setting and a third switch setting, said second switch setting occurring between said first switch setting and said third switch setting, and said group of switches causing said inductor to be fed with current from said direct current voltage source in said second switch setting, said group of switches in said third switch setting causing the PIN diode and the inductor to be separated from the direct current voltage source and connected in a closed current loop, and causing the inductor to generate a discharge current upon transition to said further switch setting, said discharge current being directed to the PIN diode in a direction opposite to the current generated by the direct current voltage source.

2. A circuit as claimed in claim 1 wherein said inductor is a coil.

3. A circuit as claimed in claim 1 wherein said group of switches in said second switch setting preclude said PIN diode from being fed with current by said direct current voltage source.

4. A circuit as claimed in claim 1 wherein said group of switches in said second switch setting cause said PIN diode to be fed with current by said direct current voltage source.

5. A circuit as claimed in claim 1, comprising:
a first current branch on which said PIN diode is connected;
a second current branch in which said inductor is connected, said second current branch being connected in parallel with said first current branch;
a first switch in said group of switches being connected in said first current branch in connection with the PIN diode;
a second switch and a third switch in said group of switches being connected in series with said inductor respectively on opposite sides of said inductor in said second current branch; and
an additional diode connecting said first current branch with said second current branch, said additional diode being switched from the first current branch into the second current branch in a conducting direction of the additional diode.

6. A circuit as claimed in claim 5 wherein said second switch and said third switch are switched by said first switch.

7. A circuit as claimed in claim 1 comprising:
said group of switches in said second switch setting precluding said PIN diode from being fed with current by said direct current voltage source;
in said first switch setting, said first switch being closed and at least one of said second switch and said third switch being open;
in said second switch setting, said first switch being open and said second switch and said third switch being closed; and
in said third switch setting, said first switch and said third switch being opened and said second switch being closed.

8. A circuit as claimed in claim 7 wherein said second switch and said third switch are switched by said first switch.

9. A circuit as claimed in claim 1 comprising:
said group of switches in said second switch setting causing said PIN diode to be fed with current by said direct current voltage source;
in said first switch setting, said first switch being closed and at least one of said second switch and said third switch being open;
in said second switch setting, said first, second and third switches being closed; and
in said third switch setting, said first switch and said third switch being open and said second switch being closed.

10. A circuit as claimed in claim 9 wherein said second switch and said third switch are switched by said first switch.

11. A circuit as claimed in claim 1 comprising a control unit connected to said group of switches that controls switching of said group of switches.

12. A circuit as claimed in claim 1 comprising a radio-frequency resistor connected in series at an anode side of said PIN diode.

13. A transmission/reception diplexer for a magnetic resonance apparatus comprising:
at least one switching circuit;
each switching circuit comprising a PIN diode, an inductor, a direct current voltage source, a group of switches, said group of switches being settable to a first switch setting that causes the PIN diode to be fed with current from the direct current voltage source in a conducting direction of the PIN diode, and said group of switches being settable to a further switch setting that causes the PIN diode and the inductor to be separated from the direct current voltage source and connected in a closed current loop, causing the inductor to generate a discharge current upon transition to said further switch setting, said discharge current being directed to the PIN diode in a direction opposite to the current generated by the direct current voltage source;
said group of switches in said first switch setting precluding said inductor from being fed with current, and said group of switches being switchable to a second switch setting and a third switch setting, said second switch setting occurring between said first switch setting and said third switch setting, and said group of switches causing said inductor to be fed with current by said direct current voltage source in said second switch setting; and
said at least one switching circuit being configured to switch into a reception mode at a beginning of said third switch setting.

14. A magnetic resonance apparatus comprising:
a radio-frequency coil; and
a transmission reception diplexer connected to said radio-frequency coil, said transmission/reception diplexer comprising at least one switching circuit, each switching circuit comprising a PIN diode, an inductor, a direct current voltage source, a group of switches, said group of switches being settable to a first switch setting that causes the PIN diode to be fed with current from the direct current voltage source in a conducting direction of the PIN diode, and said group of switches being settable to a further switch setting that causes the PIN diode and the inductor to be separated from the direct current voltage source and connected in a closed current loop, causing the inductor to generate a discharge current upon transition to said further switch setting, said discharge current being directed to the PIN diode in a direction opposite to the current generated by the direct current voltage source, said group of switches in said first switch setting precluding said inductor from being fed with current, and said group of switches being switchable to a second switch setting and a third switch setting, said second switch setting occurring between said first switch setting and said third switch setting, and said group of switches causing said inductor to be fed with current by said direct current voltage source in said second switch setting, and said at least one switching circuit being configured to switch said radio-frequency coil into a reception mode at a beginning of said third switch setting.

\* \* \* \* \*